(12) United States Patent
Lee et al.

(10) Patent No.: US 12,130,402 B2
(45) Date of Patent: Oct. 29, 2024

(54) CORE ELECTRODES BASED ON MULTIPLE ROD, AND UNDERWATER ELECTRIC FIELD SENSOR ELECTRODES AND UNDERWATER ELECTRIC FIELD SENSOR HAVING THE SAME

(71) Applicant: AGENCY FOR DEFENSE DEVELOPMENT, Daejeon (KR)

(72) Inventors: Sangkyu Lee, Daejeon (KR); Hyun Ju Chung, Daejeon (KR); Chang Seob Yang, Daejeon (KR)

(73) Assignee: AGENCY FOR DEFENSE DEVELOPMENT, Daejeon (KR)

( * ) Notice: Subject to any disclaimer, the term of this patent is extended or adjusted under 35 U.S.C. 154(b) by 202 days.

(21) Appl. No.: 17/659,649

(22) Filed: Apr. 18, 2022

(65) Prior Publication Data
US 2022/0404517 A1 Dec. 22, 2022

(30) Foreign Application Priority Data
Jun. 16, 2021 (KR) .......................... 10-2021-0077952

(51) Int. Cl.
  *G01V 3/08* (2006.01)
  *G01R 1/04* (2006.01)
  *G01R 29/14* (2006.01)
(52) U.S. Cl.
  CPC .............. *G01V 3/088* (2013.01); *G01R 1/04* (2013.01); *G01R 29/14* (2013.01)
(58) Field of Classification Search
  CPC ........... G01V 3/088; G01V 2210/1423; G01V 2210/1427; G01R 1/04; G01R 29/14; G01R 29/12
  See application file for complete search history.

(56) References Cited

U.S. PATENT DOCUMENTS 10,082,546 B2 9/2018 Hibbs et al.
2008/0246485 A1 10/2008 Hibbs et al.

FOREIGN PATENT DOCUMENTS

| CN | 104155532 A | * 11/2014 |
| CN | 208172106 U | * 11/2018 |
| CN | 111650649 A | 9/2020 |
| JP | 2010-512538 A | 4/2010 |
| KR | 10-1582260 B1 | 1/2016 |
| WO | WO 2008/073375 A3 | 6/2008 |

OTHER PUBLICATIONS

Korean Office action for application No. KR 10-2021-0077952, dated Jun. 7, 2023, 4 pages and English translation, 4 pages.
Korean Written Decision on Registration for Application No. 10-2021-0077952, dated Jan. 3, 2024, 2 pages and English Translation, 3 pages.

* cited by examiner

*Primary Examiner* — Amy He
(74) *Attorney, Agent, or Firm* — Lewis Roca Rothgerber Christie LLP

(57) ABSTRACT

A core electrode based on multiple rods, which is a core electrode employed in an underwater electric field sensor electrode, includes: a signal part to which a signal line is connected; a seawater reaction part that electrochemically reacts with seawater; and a waterproof molding part for waterproofing the signal part, in which the seawater reaction part is composed of a plurality of rods made of a silver-silver chloride.

4 Claims, 17 Drawing Sheets

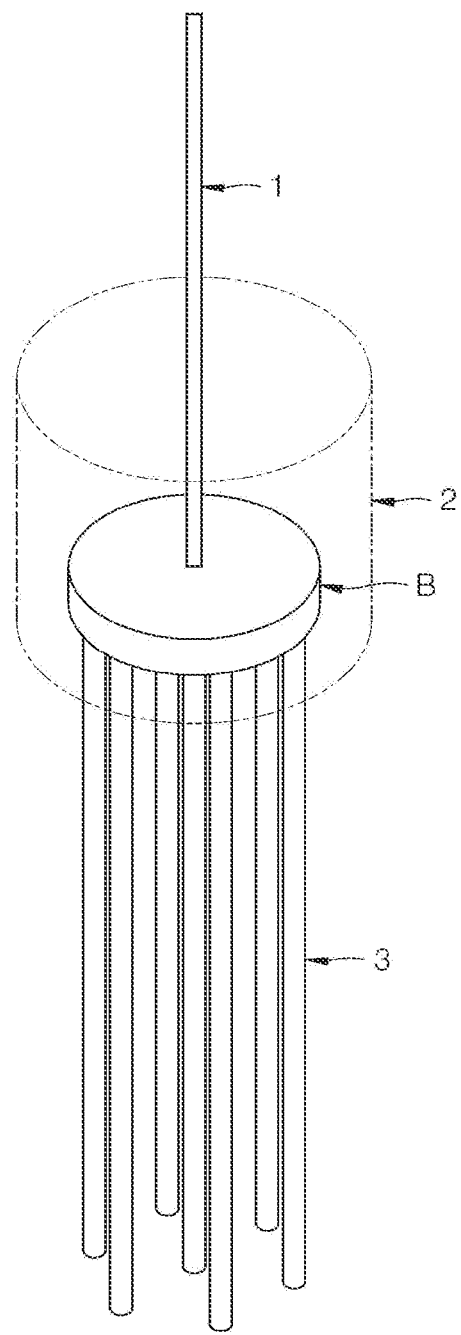
[FIG. 1]

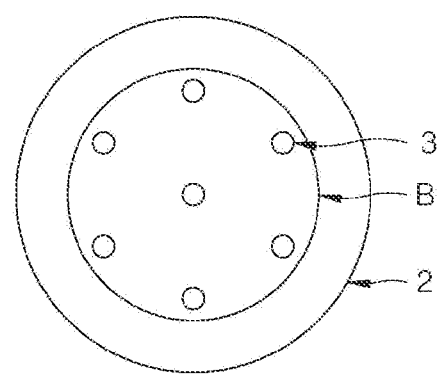
[FIG. 2]

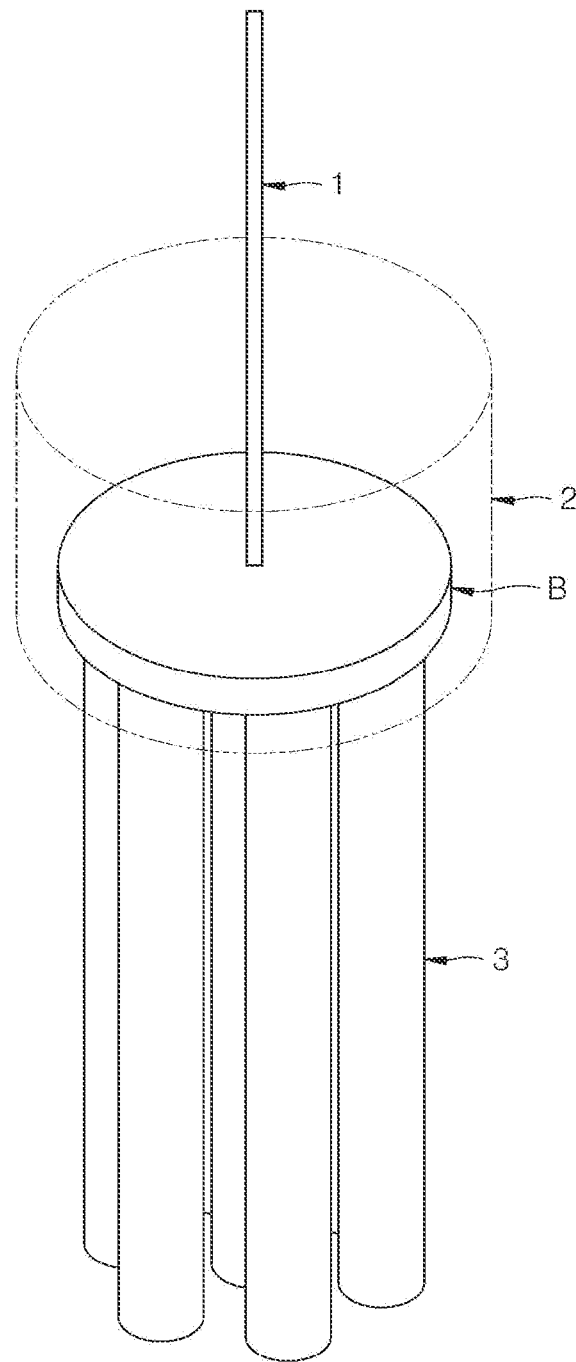
[FIG. 3]

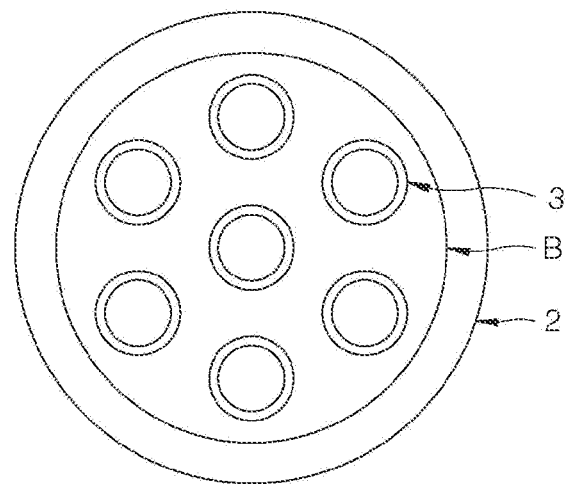
[FIG. 4]

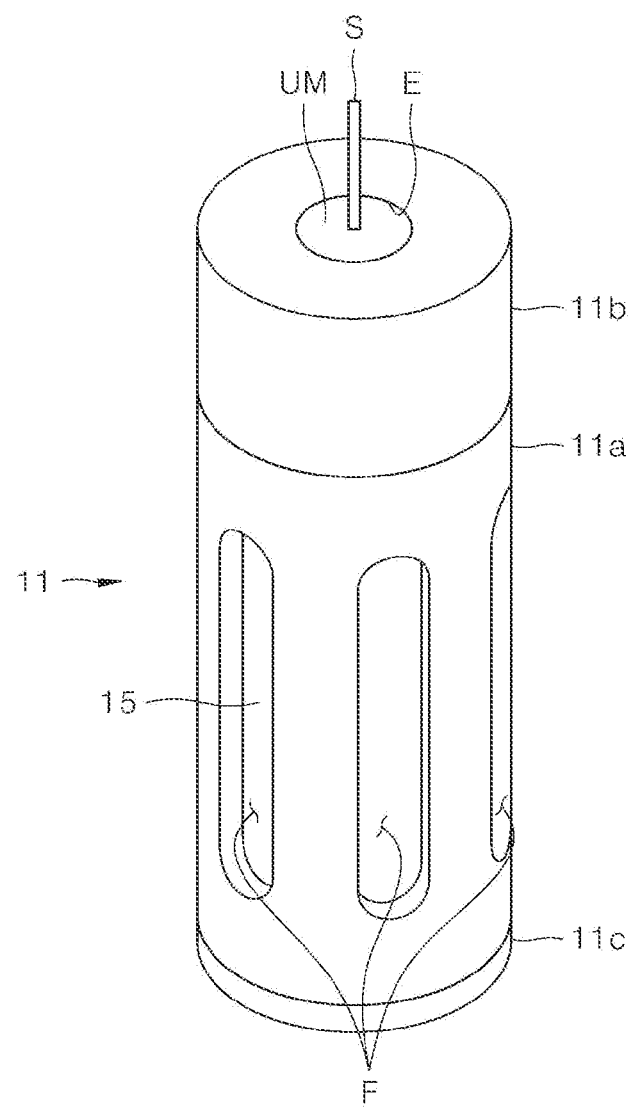

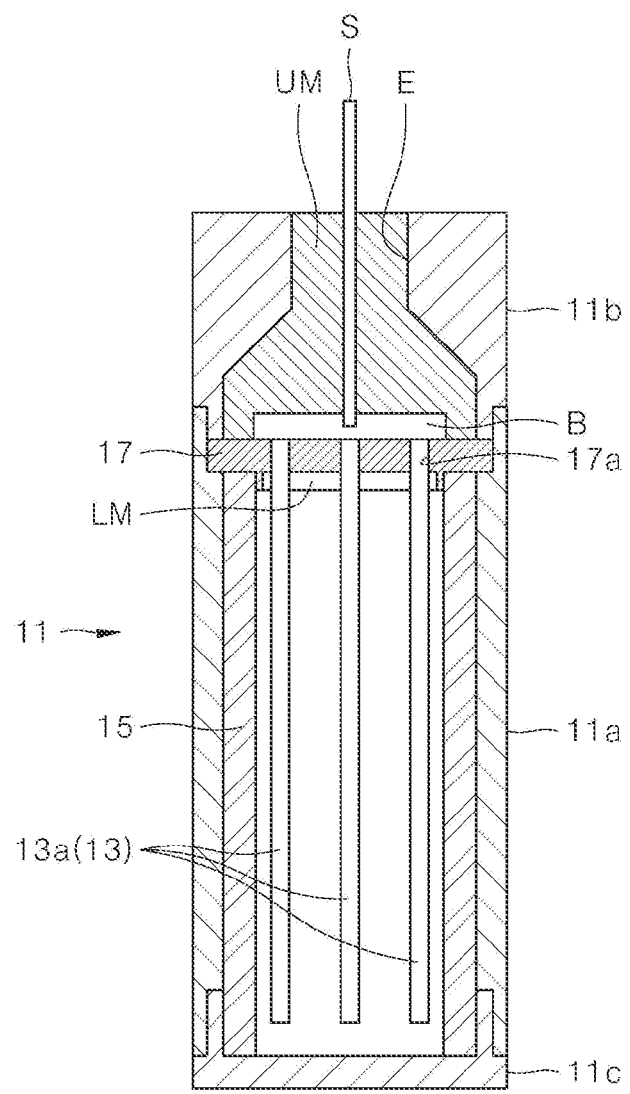
[FIG. 6]

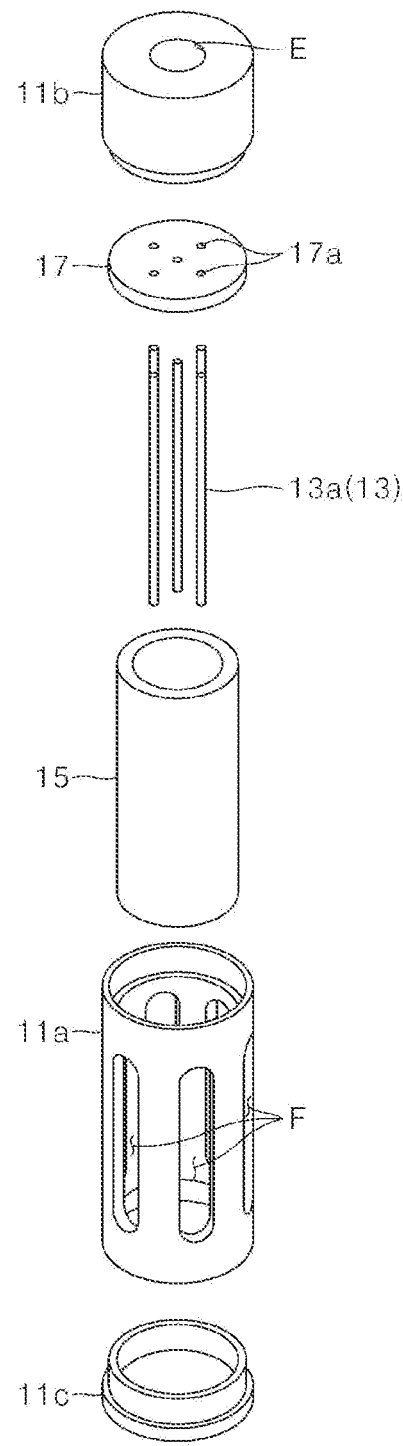

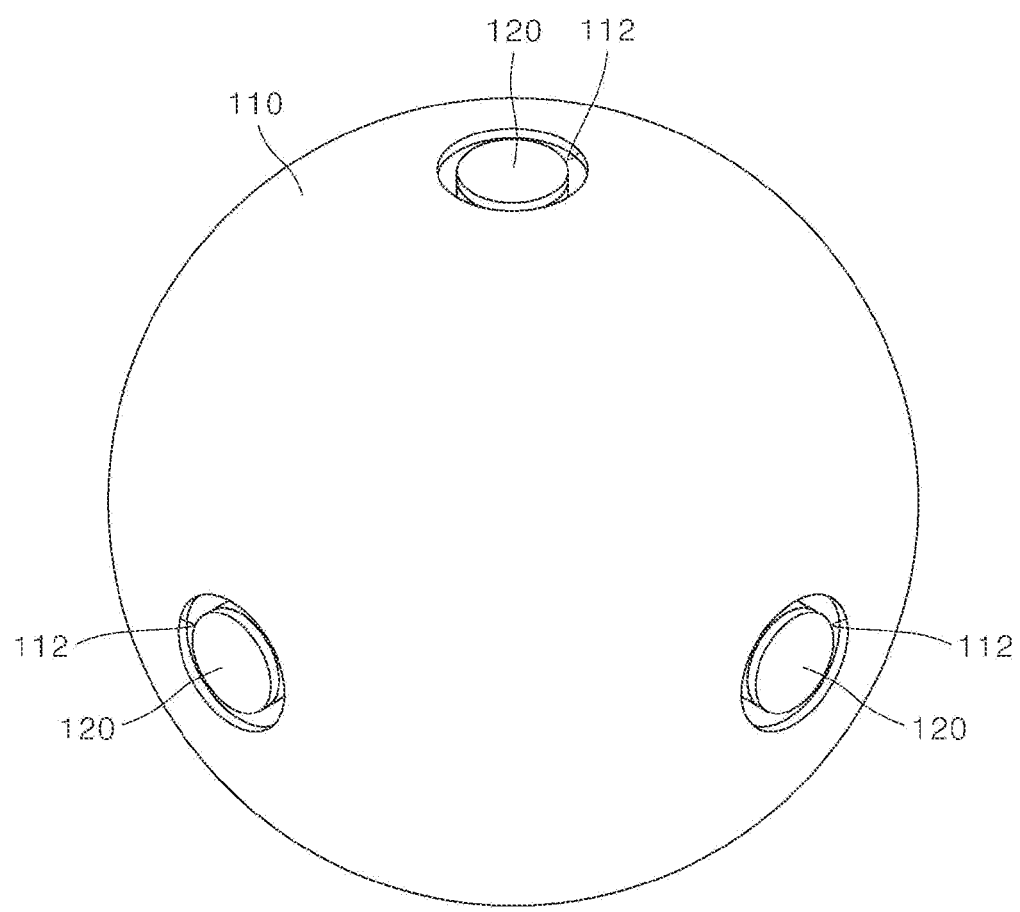

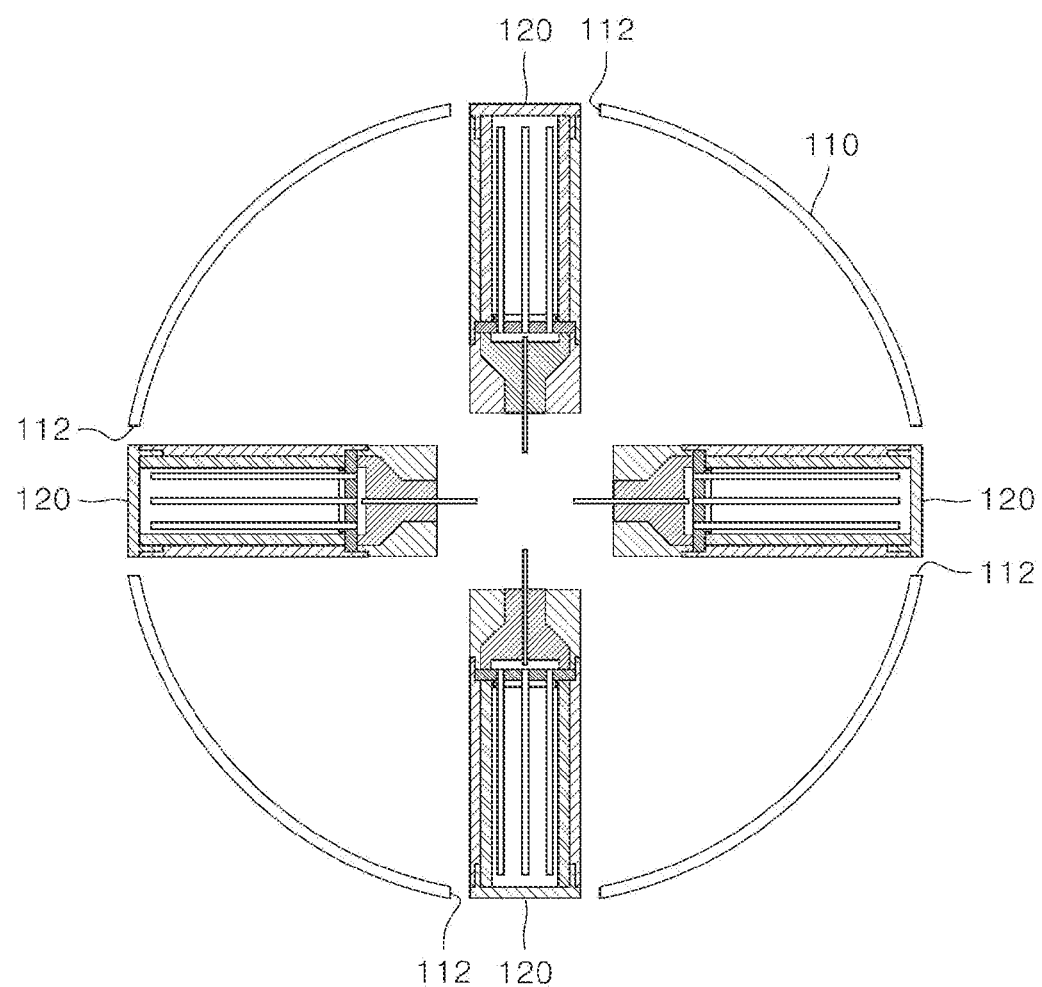
[FIG. 9]

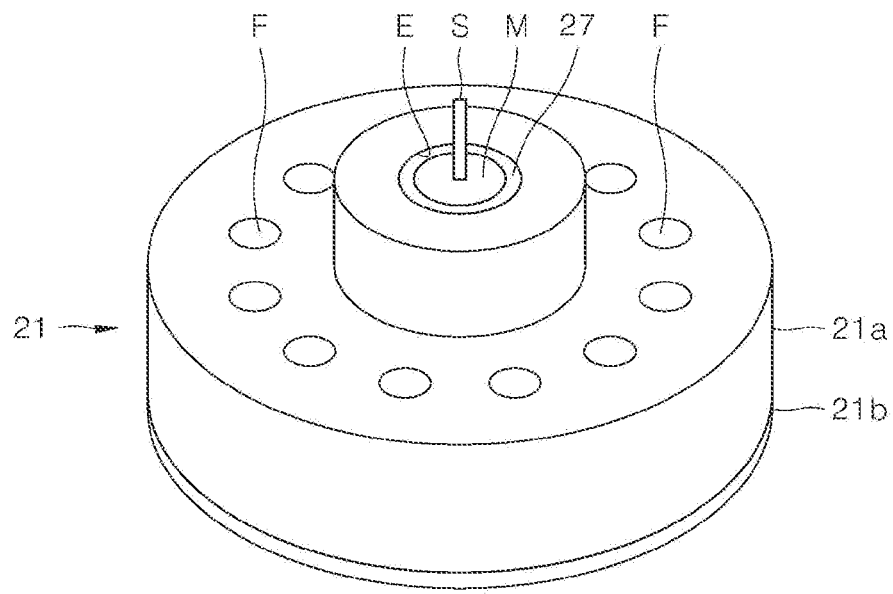
[FIG. 10]
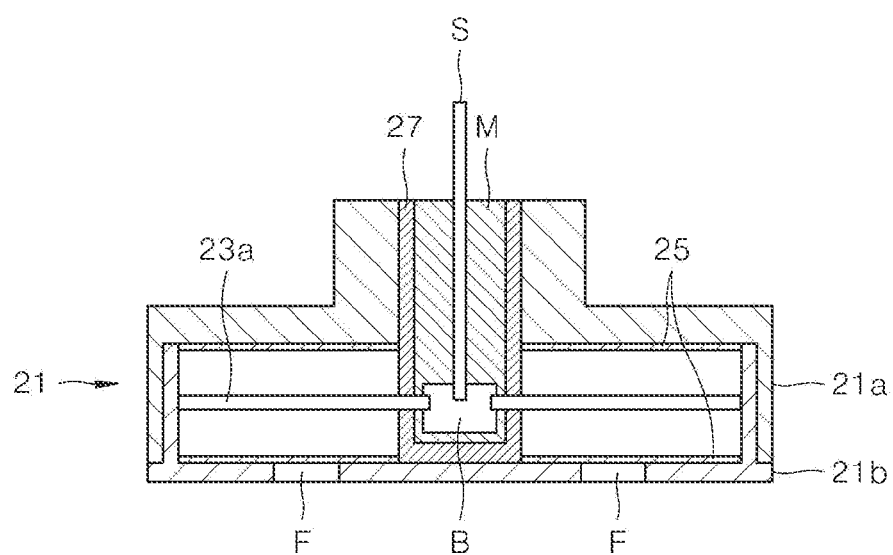
[FIG. 11]

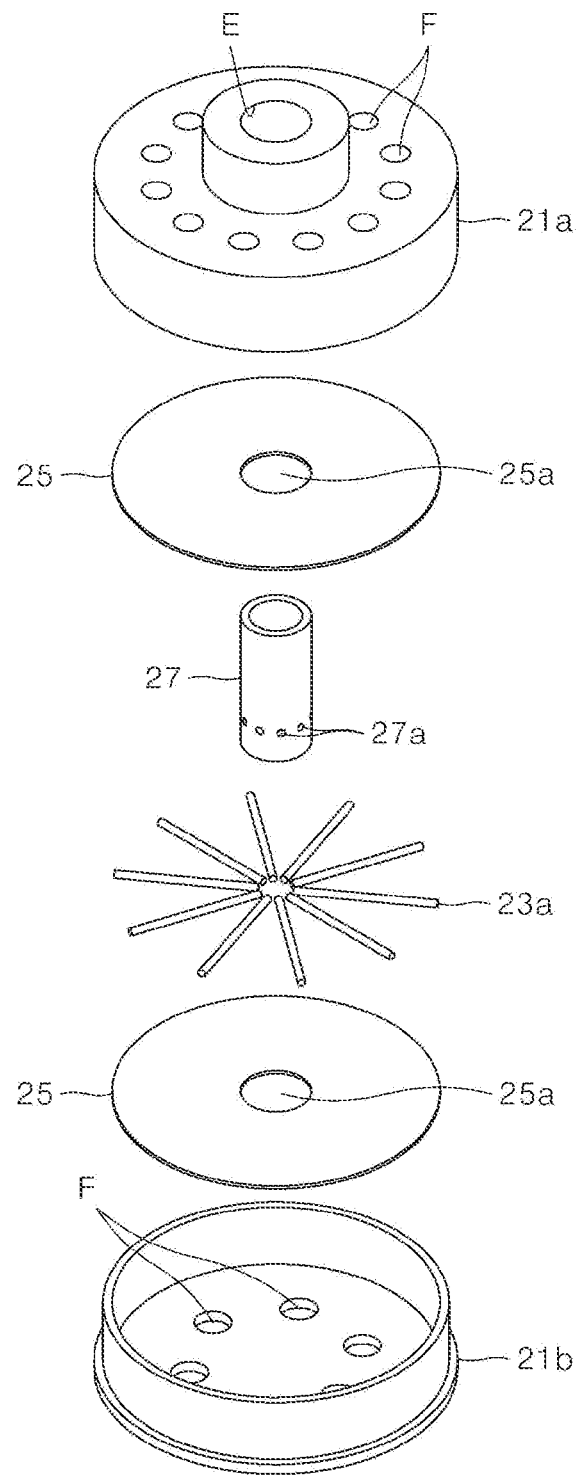

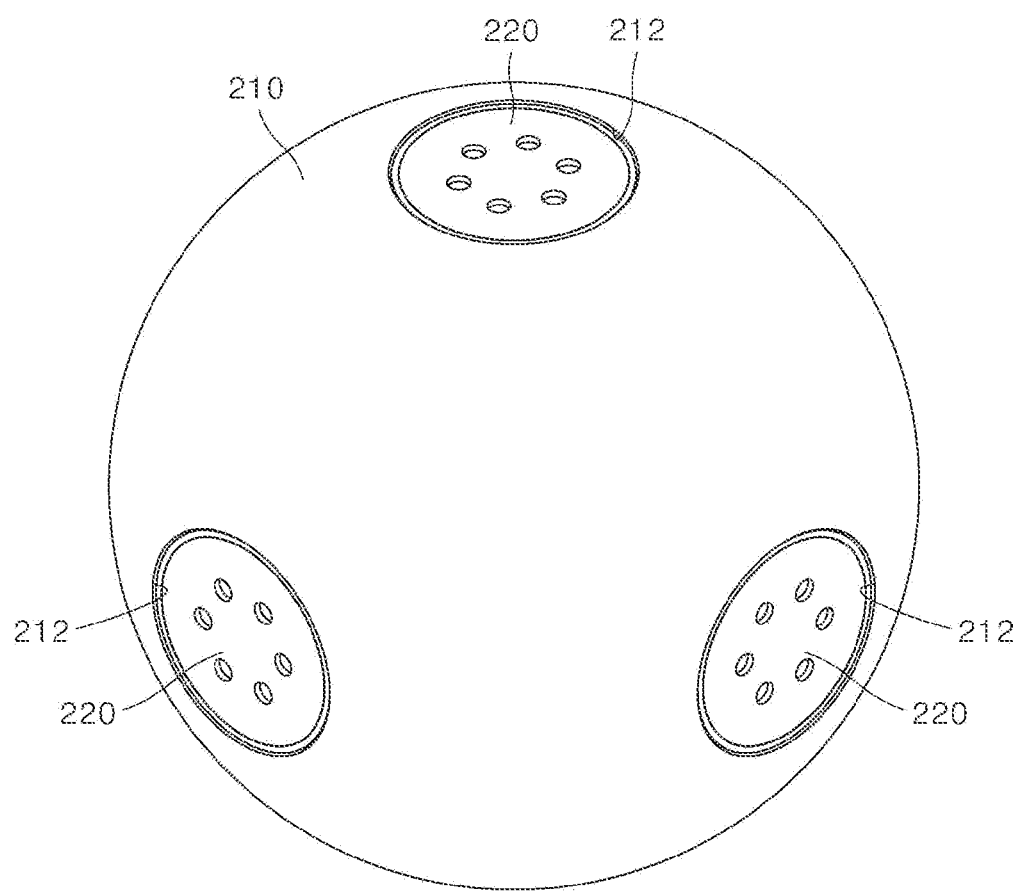
[FIG. 13]

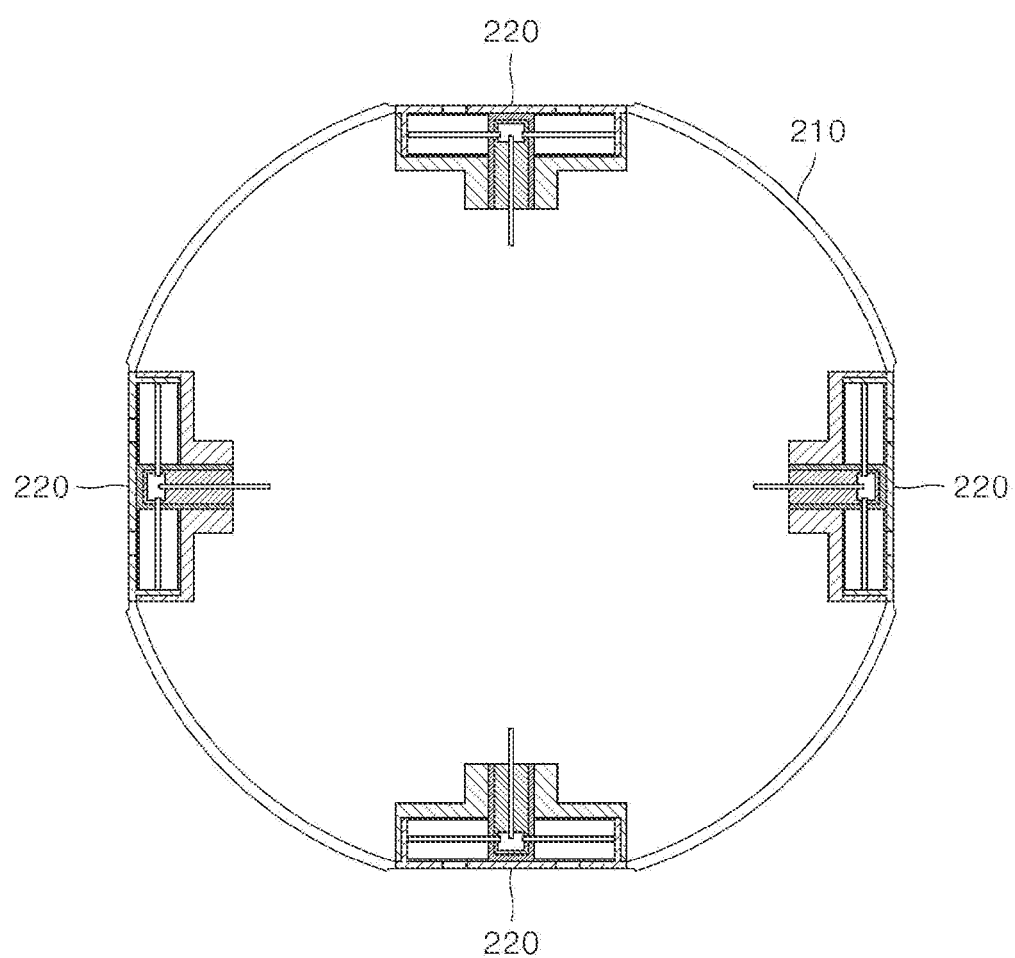
[FIG. 14]

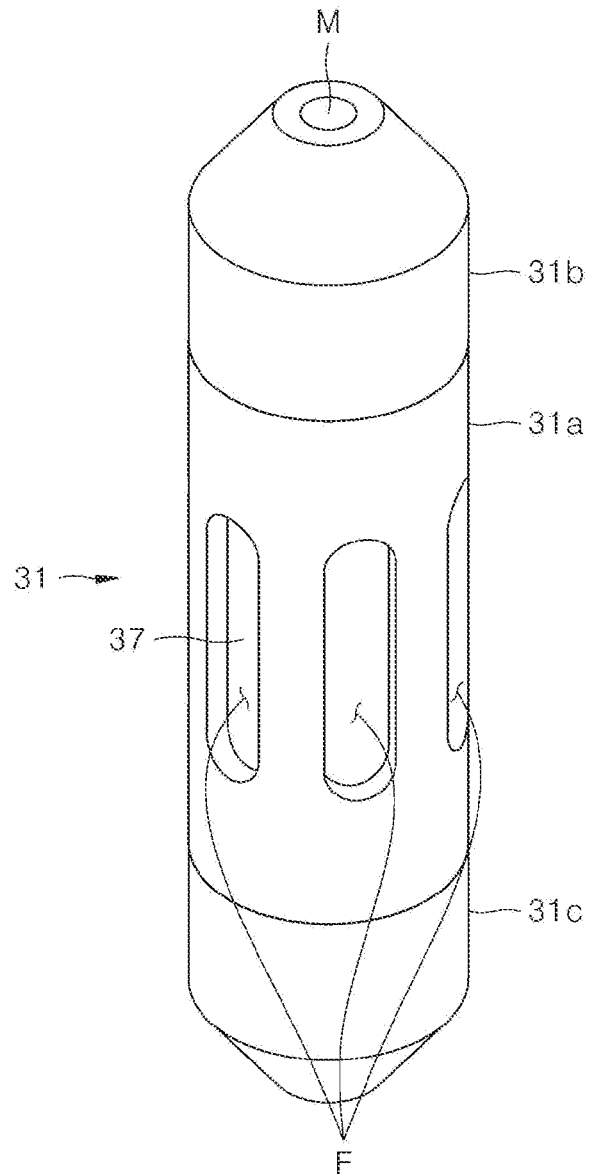
[FIG. 15]

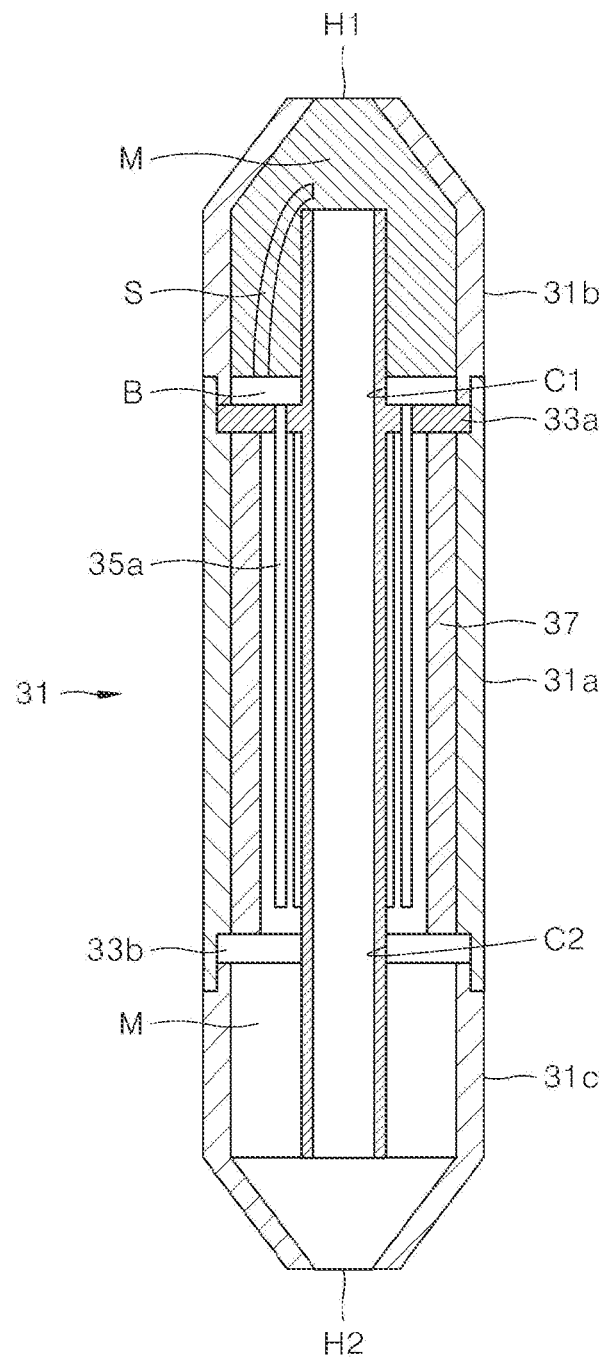
[FIG. 16]

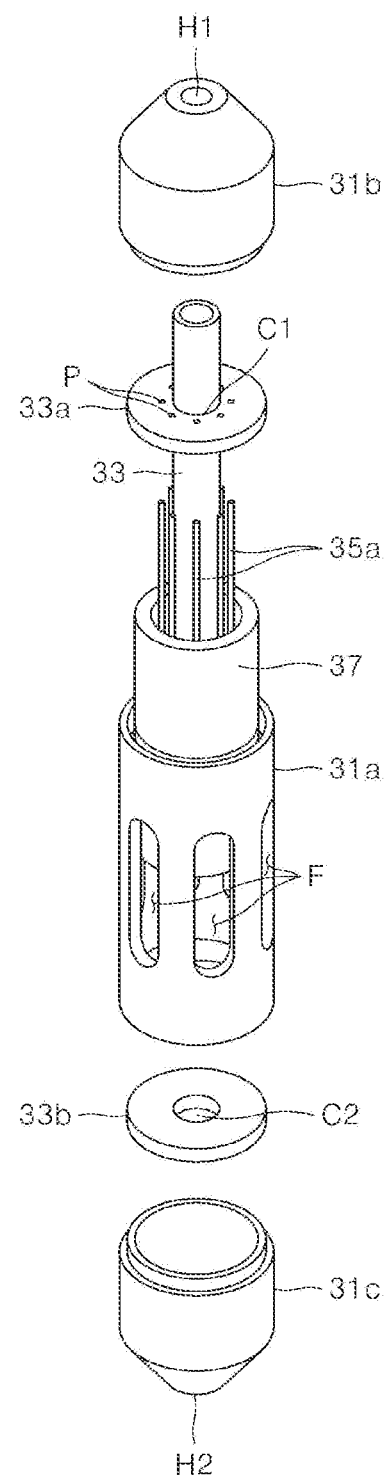
[FIG. 17]

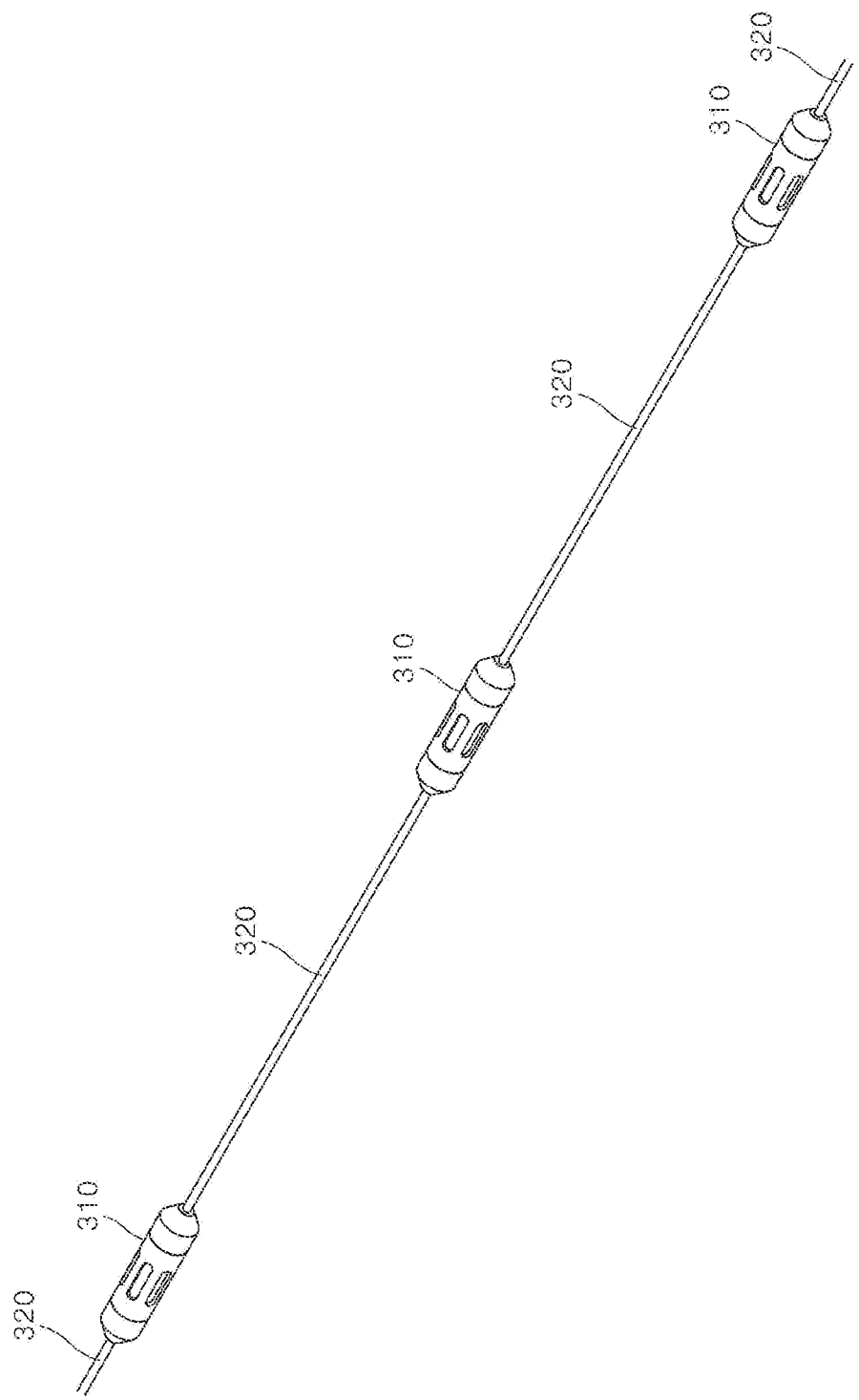

CORE ELECTRODES BASED ON MULTIPLE ROD, AND UNDERWATER ELECTRIC FIELD SENSOR ELECTRODES AND UNDERWATER ELECTRIC FIELD SENSOR HAVING THE SAME

CROSS-REFERENCE TO RELATED APPLICATION(S)

This application claims the benefit of Korean Patent Application No. 10-2021-0077952, filed on Jun. 16, 2021, the disclosure of which is herein incorporated by reference in its entirety.

FIELD OF THE INVENTION

The present disclosure relates to a core electrode based on multiple rods, and an underwater electric field sensor electrode and underwater electric field sensor having the same. In detail, the present disclosure relates to a core electrode based on multiple rods which has various shapes and performance required for an electric sensor, and an underwater electric field sensor electrode and underwater electric field sensor having the same.

DESCRIPTION OF THE RELATED ART

An underwater electric field sensor (hereafter, UEFS) is a sensor that is generally used in seawater and measures an electric field signal E described below using a potential difference $\Delta V$ of two electrodes disposed underwater and an inter-electrode distance L.

$$E = \frac{\Delta V}{L}$$

An electric field sensor is used electric exploration of seabed resources, detection of objects in the sea bottom, detection of objects moving underwater, etc., and is classified into 1-axis, 2-axis, and 3-axis electric field sensors, depending on the number of electrodes and spatial disposition.

A 3-axis electric field sensor that can measure electric field signals in three perpendicular axial directions is the most generally used.

An underwater electric field sensor is composed of electrodes that respond to an underwater electric field signal, and a signal amplifier that amplifies and filters a potential difference signal of two electrodes.

An underwater electric field sensor electrode is divided into a core electrode, a seawater filter, and an electrode housing.

The core electrode is composed of a signal line part to which a signal line is connected, a seawater reaction part that electrochemically reacts with seawater, and a waterproof molding part for waterproofing the signal line part.

The main material of the core electrode is a silver-silver chloride that is used as a reference electrode in electrochemical tests.

The seawater filter is made of polypropylene, etc., and prevents contamination inside the electrode housing and reduces influence by the speed of a current when seawater outside the electrode housing flows into the electrode housing.

The electrode housing is made of a plastic-based material such as polyoxymethylene, protects the core electrode from external shock, and has a shape of an assembly of the core electrode and the seawater filter.

A sensor electrode is manufactured in a solid type, unlike a reference electrode including a saturated potassium chloride electrolyte, in which seawater flowing in the electrode functions as an electrolyte.

A sensor electrode may be manufactured by putting silver chloride or a silver chloride/silica mixture around a core electrode in an electrode to improve the lifespan of the silver-silver chloride core electrode and stability of sensor reception signal.

The performance of an underwater electric field sensor is usually determined by the shape and the manufactured state of the core electrode.

In particular, a sensor noise characteristic that is a representative characteristic of sensors changes in accordance with the surface area of a seawater reaction part depending on the shape of a core electrode and the film state of silver chloride.

As the surface of the seawater reaction part of a core electrode increases, the impedance between sensor electrodes decreases, and accordingly, the sensor noise characteristic is improved.

The film state of silver chloride of a silver-silver chloride core electrode changes in accordance with the pretreatment of a silver electrode and a silver chloride deposition condition, and the sensor noise characteristic correspondingly changes.

Pretreatment of a silver electrode having purity over 99.99% is generally performed through surface grinding for removing contaminants an oxide film, organics, etc. on the surface, and wet-cleaning that uses acetone, nitric acid, deionized water, etc.

The silver surface of the silver electrode that has undergone pretreatment is anodic-oxidized by a current or a voltage applied in a potassium chloride or a sodium chloride electrolyte, so it becomes a silver-silver chloride electrode deposited with a silver chloride film.

Accordingly, the silver chloride film state may be changed by not only pretreatment of the silver electrode, but whether it is an anodic oxidization condition, the magnitude of a voltage or a current, the anodic oxidization time, the concentration and temperature of the electrolyte.

One silver rod is generally used to manufacture a silver-silver chloride reference electrode, but one silver tube deposited with an anodic-oxidization film may be used to increase the surface of a seawater reaction part when an electric field sensor electrode is manufactured.

Recently, an example of using a sintered electrode after compressing-forming of powder of a mixture of silver and a silver chloride in order to further increase the surface area of a seawater reaction part has been published in a literature.

Various shapes and performance of an electrode are required in accordance with the applications of an electric field sensor, and accordingly, it is required to change the shape of a core electrode of the electric field sensor.

However, since the conditions of a process of manufacturing a silver-silver chloride electrode are necessarily changed when changing the shape of a core electrode of existing electric field sensor electrodes, so it is difficult to predict the performance and it is required to derive optimal process conditions suitable for the changed shape of the core electrode.

Accordingly, existing electric field sensor electrodes are mostly manufactured in a cylindrical shape and it is difficult to develop products having various shapes and performance.

DOCUMENTS OF RELATED ART (Patent Document 1) KR 10-1582260 B1 (publisehd on Jan. 11, 2016)

SUMMARY OF THE INVENTION

The present disclosure has been made in an effort to solve the problems in the related art described above, and an object of the present disclosure is to provide a core electrode based on multiple rods which has various shapes and performance required for an electric sensor, and an underwater electric field sensor electrode and underwater electric field sensor having the same.

In order to achieve the objects described above, a core electrode based on multiple rods according to a first aspect of the present disclosure, which is a core electrode employed in an underwater electric field sensor electrode, includes: a signal part to which a signal line is connected; a seawater reaction part that electrochemically reacts with seawater; and a waterproof molding part for waterproofing the signal part, in which the seawater reaction part is composed of a plurality of rods made of a silver-silver chloride.

The seawater reaction part may be composed of solid-type cylindrical rods or hollow cylindrical rods.

Further, it is preferable that the signal part is formed by attaching a silver surface at the upper portion of the seawater reaction part and the signal line using a conductive adhesive.

Further, the waterproof molding part is formed by molding a joint between the seawater reaction part and the signal line for a waterproofing function.

A first embodiment of an underwater electric field sensor electrode according to a second aspect of the present disclosure includes; an electrode housing formed in a hollow cylindrical shape having a predetermined length; a core electrode including seawater reaction parts that are a plurality of rods made of a silver-silver chloride and vertically disposed in the circumferential direction of the electrode housing; and a seawater filter formed in a hollow cylindrical shape having a predetermined length and open top and bottom, vertically disposed in the housing electrode, and having the seawater reaction parts of the core electrode therein.

The electrode housing includes: a housing body formed in a hollow cylindrical shape with open top and bottom; an upper cover covering an upper portion of the housing body; and a lower cover covering a lower portion of the housing body.

A plurality of seawater inlets is circumferentially formed through inner and outer surfaces of the housing body.

Further, a disc-shaped guide block is horizontally disposed at an upper end of the seawater filter, a plurality of through-holes is vertically formed through the guide block, and upper ends of the seawater reaction parts that are a plurality of rods are fitted and fixed in the plurality of through-holes, respectively.

Further, lower molding is applied to a bottom of the guide block for a waterproofing function.

Further, upper molding is applied to a top of the guide block after connecting silver surfaces of the seawater reaction parts that are silver-silver chloride rods and a signal line using a conductive adhesive.

When upper molding is applied, a molding material is injected through an injection port formed at an upper end of the upper cover.

Further, it is preferable that the seawater filter is inserted through the lower portion of the housing body.

A first embodiment of an underwater electric field sensor according to a third aspect of the present disclosure includes: a sensor housing formed in a spherical shape having a plurality of accommodation grooves spaced apart from each other on an outer surface thereof; and the underwater electric field sensor electrode according to the first embodiment described above which is accommodated in each of the plurality of accommodation grooves.

A second embodiment of an underwater electric field sensor electrode according to the second aspect of the present disclosure includes: an electrode housing formed in a hollow disc shape having a predetermined thickness; a core electrode including seawater reaction parts that are a plurality of rods made of a silver-silver chloride and horizontally disposed in the circumferential direction of the electrode housing; and seawater filters provided as a pair of discs having a predetermined thickness, transversely disposed in the electrode housing, and disposed over and under the seawater reaction part of the core electrode, respectively.

The electrode housing includes: a housing body formed in a hollow disc shape and having an open bottom; and a lower cover covering a lower portion of the housing body, and a plurality of seawater inlets is formed at the housing body and the lower cover.

Further, a cylindrical guide block is longitudinally disposed between the pair of seawater filters, a plurality of through-holes is vertically formed on an outer surface of the guide block, and inner ends of the seawater reaction parts that are a plurality of rods are fitted and fixed in the plurality of through-holes, respectively.

Further, molding is applied to an inner surface of the guide block after connecting silver surfaces of the seawater reaction parts that are silver-silver chloride rods and a signal line using a conductive adhesive.

Further, a fitting hole is formed at a center of each of the pair of the seawater filters and the guide block is fitted in the fitting holes.

Further, it is preferable that when molding is applied, a molding material is injected through an injection port formed at an upper end of the housing body.

A second embodiment of an underwater electric field sensor according to the third aspect of the present disclosure includes: a sensor housing formed in a spherical shape having a plurality of accommodation grooves spaced apart from each other on an outer surface thereof; and the underwater electric field sensor electrode according to the second embodiment described above which is accommodated in each of the plurality of accommodation grooves.

A third embodiment of an underwater electric field sensor electrode according to the second aspect of the present disclosure includes: a electrode housing formed in a hollow cylindrical shape having a predetermined length; a guide block formed in a hollow cylindrical shape having a predetermined length and open top and bottom, and longitudinally disposed in the longitudinal direction of the electrode housing; a core electrode including seawater reaction parts that are a plurality of rods made of a silver-silver chloride and longitudinally disposed outside the guide block in the circumferential direction of the guide block; and a seawater filter formed in a hollow cylindrical shape having a predetermined length with open top and bottom, longitudinally disposed in the electrode housing, and having the seawater reaction parts of the core electrode and the guide block therein.

The electrode housing includes: a housing body formed in a hollow cylindrical shape with open top and bottom; an upper cover covering an upper portion of the housing body; and a lower cover covering a lower portion of the housing body.

Further, a plurality of seawater inlets is circumferentially formed through inner and outer surfaces of the housing body.

Further, a first guide plate having a disc shape is disposed on an outer surface of an upper portion of the guide block and fixed to an upper end of the seawater filter, a second guide plate having a disc shape is disposed on an outer surface of an lower portion of the guide block and fixed to a lower end of the seawater filter, a plurality of through-holes is vertically formed through the first guide plate, and upper ends of the seawater reaction parts that are a plurality of rods are fitted and fixed in the plurality of through-holes, respectively.

Further, a first coupling hole and a second coupling hole are formed respectively at centers of the first guide plate and the second guide plate such that the guide block is fitted.

A top of the first guide plate connects a silver surface of the seawater reaction parts that are silver-silver chloride rods and a signal line through a conductive adhesive, and the signal line is molded after being electrically connected with an underwater cable core line.

Further, the underwater cable is disposed through the guide block, and a first through-hole and a second through-hole are formed at the upper cover and the lower cover, respectively, to pass the underwater cable.

Further, after the underwater cable is disposed through the first through-hole, the guide block, and the second through-hole, the inside of the upper cover and the inside of the lower cover are molded for waterproofing.

Further, lower molding is applied to a bottom of the first guide plate for a waterproofing function.

A third embodiment of an underwater electric field sensor according to the third aspect of the present disclosure has the underwater electric field sensor electrodes according to the third embodiment described above which are connected to each other through underwater cables, thereby functioning as an array sensor that measures an electric field signal through multiple channels.

Details of other embodiments are included in detailed description of the invention" and the accompanying "drawings".

The advantages and/or features of the present disclosure, and methods of achieving them will be clear by referring to the exemplary embodiments that will be describe hereafter in detail with reference to the accompanying drawings.

However, the present disclosure is not limited to the exemplary embodiments described hereafter and may be implemented in various ways, and the exemplary embodiments are provided to complete the description of the present disclosure and let those skilled in the art completely know the scope of the present disclosure and the present disclosure is defined by claims.

According to the summary, the present disclosure has the following effects.

According to the present disclosure, since a core electrode is manufactured by providing a plurality of silver-silver chloride rods having the same shape, there is an advantage that it is possible to easily change the shape of the underwater electric field sensor electrode in accordance with the disposition structure of the silver-silver chloride rods.

Since the silver-silver chloride rods of the core electrode are the same even if the shape of the underwater electric field sensor electrode based on multiple rods is changed, it is not required to consider an electrode characteristic change due to a change of silver chloride deposition conditions.

Further, it is easy to change the area of the seawater reaction part of the core electrode when the number of the based on multiple rods is changed, and it is possible to predict corresponding performance.

Accordingly, it is possible to manufacture various electrodes for each performance required for sensor electrodes and the underwater electric field sensor electrode based on multiple rods is suitable for manufacturing various electrodes.

Further, it is possible to manufacture the silver-silver chloride rods that are core parts of a sensor electrode in a standardized shape under verified process condition, it is easy to change the shape in accordance with disposition of the rods, and it is possible to change the performance according to a change of the number of the rods.

Further, when a plurality of kinds of silver-silver chloride rods having an optimal silver chloride deposition condition is standardized and used, if necessary, it is possible to manufacture a sensor electrode based on multiple rods which has more various shapes and performance.

BRIEF DESCRIPTION OF THE DRAWINGS

The above and other objectives, features and other advantages of the present disclosure will be more clearly understood from the following detailed description when taken in conjunction with the accompanying drawings, in which:

FIG. 1 is a view showing a first embodiment of a core electrode based on multiple rods according to the present disclosure;

FIG. 2 is a bottom view of the core electrode shown in FIG. 1;

FIG. 3 is a view showing a second embodiment of a core electrode based on multiple rods according to the present disclosure;

FIG. 4 is a bottom view of the core electrode shown in FIG. 3;

FIG. 5 is a view showing a first embodiment of an underwater electric field sensor electrode according to the present disclosure;

FIG. 6 is a view showing the internal structure of the underwater electric field sensor electrode of FIG. 5;

FIG. 7 is an exploded view of the underwater electric field sensor electrode of FIG. 5;

FIG. 8 is a view showing an underwater electric field sensor employing the underwater electric field sensor electrode of FIG. 5;

FIG. 9 is a view showing the internal structure of the underwater electric field sensor of FIG. 8;

FIG. 10 is a view showing a second embodiment of an underwater electric field sensor electrode according to the present disclosure;

FIG. 11 is a view showing the internal structure of the underwater electric field sensor electrode of FIG. 10;

FIG. 12 is an exploded view of the underwater electric field sensor electrode of FIG. 10;

FIG. 13 is a view showing an underwater electric field sensor employing the underwater electric field sensor electrode of FIG. 10;

FIG. 14 is a view showing the internal structure of the underwater electric field sensor of FIG. 13;

FIG. 15 is a view showing a third embodiment of an underwater electric field sensor electrode according to the present disclosure;

FIG. 16 is a view showing the internal structure of the underwater electric field sensor electrode of FIG. 15;

FIG. 17 is an exploded view of the underwater electric field sensor electrode of FIG. 15; and FIG. 18 is a view showing an underwater electric field sensor employing the underwater electric field sensor electrode of FIG. 15.

DETAILED DESCRIPTION OF THE INVENTION

Hereafter, preferred embodiments of the present disclosure are described in detail with reference to the accompanying drawings.

Before describing the present disclosure in detail, terms or words used herein should not be construed as being limited to common or dictionary meanings, the concepts of various terms may be appropriately defined to the most optimally describe the invention by the inventor(s), and it should be noted that those terms or words should be construed as meanings and concepts corresponding to the technical spirit of the present disclosure.

That is, it should be noted that the terms used herein are used only to describing preferred embodiments of the present disclosure, not intending to limit the present disclosure in detail, and those terms are terms defined in consideration of various possibilities of the present disclosure.

Further, it should be noted that, in the specification, singular expression may include plural expression unless clearly stated in the sentences, and includes a singular meaning even if it is similarly expressed as a plural number.

It should be noted that when a component is described as "including" another component throughout the specification, the component may further include another component without another component excluded, unless specifically stated otherwise.

Further, it should be noted that when a component is described as "exists in" and "is connected to" another component, the component may be directly connected with another component, may be installed in contact with another component, or may be installed with a predetermined gap. When the component is installed with a gap, there may be a third component or means for fixing and connecting the component to another component, and the third component or means may not be described.

On the other hands, it should be understood that when a component is described as "directly connected" or "indirectly connected" to another component, it should be construed as there is no third component or means.

Similarly, the terms used herein to describe a relationship between elements, that is, "between", "directly between", "adjacent" or "directly adjacent" should be interpreted in the same manner as those described above.

Further, in the specification, it should be noted that terms such as "first side", "second side", "first", and "second", if used, are used to clearly discriminate one components from another component and the meaning of the corresponding component is not limited by the terms.

Further, terms related to positions such as "up", "down", "left", and "right", if used herein, should be construed as indicating relative positions of corresponding components in the corresponding figures and should not be construed as stating absolute positions unless the absolute positions of them are specified.

Further, it should be noted that, in the specification, terms such as "~part", "~er", "module", and "device", if used, mean a unit that can perform one or more functions or operations and may be implemented by hardware, software, or a combination of hardware and software.

Further, in the specification, when components are given reference numerals, the same reference numerals are given to same components even if they are shown in different figures, that is, same reference numerals indicate same components throughout the specification.

The size, position, coupling relationship, etc. of components of the present disclosure may be partially exaggerated or reduced in the accompanying drawings for the convenience of description in order to sufficiently and clearly transmit the spirit of the present disclosure, so the proportion or scale may not be precise.

Further, in the following description of the present disclosure, components that are determined to unclearly make the spirit of the present disclosure unclear, for example, well-known technology including the related art may not be described in detail.

FIG. 1 is a view showing a first embodiment of a core electrode based on multiple rods according to the present disclosure and FIG. 2 is a bottom view of the core electrode shown in FIG. 1.

A core electrode based on multiple rods according to the present disclosure, which is a core electrode that is employed in an underwater electric field sensor electrode, includes a signal part 1 to which a signal line is connected, a seawater reaction part 3 that electrochemically reacts with seawater, and a waterproof molding part 2 for waterproofing the signal part 1.

The seawater reaction part 3 is composed of a plurality of rods made of a silver-silver chloride. The silver-silver chloride rods forming the seawater reaction part 3 may selectively have various cross-sectional shapes, but are usually formed as solid-type cylindrical rods.

Further, the signal part 1 is manufactured by attaching the silver surface at the upper portion of the seawater reaction part 3 composed of the silver-silver chloride rods and the signal line using a conductive adhesive B such as silver paste.

Further, the waterproof molding part 2 is formed by molding the joint between the silver-silver chloride rods of the seawater reaction part 3 and the signal line using epoxy or urethane for a waterproofing function.

FIG. 3 is a view showing a second embodiment of a core electrode based on multiple rods according to the present disclosure and FIG. 4 is a bottom view of the core electrode shown in FIG. 3.

A core electrode based on multiple rods according to the present disclosure, which is a core electrode that is employed in an underwater electric field sensor electrode, includes a signal part 1 to which a signal line is connected, a seawater reaction part 3 that electrochemically reacts with seawater, and a waterproof molding part 2 for waterproofing the signal part 1.

The seawater reaction part 3 is composed of a plurality of rods made of a silver-silver chloride. The silver-silver chloride rods forming the seawater reaction part 3 may selectively have various cross-sectional shapes, but are formed as hollow (tube-type) cylindrical rods.

Further, the signal part 1 is manufactured by attaching the silver surface at the upper portion of the seawater reaction part 3 composed of the silver-silver chloride rods and the signal line using a conductive adhesive B such as silver paste.

Further, the waterproof molding part 2 is formed by molding the joint between the silver-silver chloride rods of the seawater reaction part 3 and the signal line using epoxy or urethane for a waterproofing function.

FIG. 5 is a view showing a first embodiment of an underwater electric field sensor electrode according to the present disclosure, FIG. 6 is a view showing the internal structure of the underwater electric field sensor electrode of FIG. 5, and FIG. 7 is an exploded view of the underwater electric field sensor electrode of FIG. 5.

A first embodiment of an underwater electric field sensor electrode according to the present disclosure includes an electrode housing 11, a core electrode 13, and a seawater filter 15.

An underwater electric field sensor electrode is manufactured in a solid type, unlike a reference electrode including a saturated potassium chloride electrolyte, in which seawater flowing in the electrode functions as an electrolyte.

The electrode housing 11 is formed in a hollow cylindrical shape having a predetermined length.

The electrode housing 11 is made of a plastic-based material such as polyoxymethylene, protects the core electrode 13 from external shock, and has a shape of an assembly of the core electrode 13 and the seawater filter 15.

The electrode housing 11 includes a housing body 11a formed in a hollow cylindrical shape with open top and bottom, an upper cover 11b covering the upper portion of the housing body 11a, and a lower cover 11c covering the lower portion of the housing body 11a.

It is preferable that the housing body 11a is formed such that the height is larger than the diameter, and a plurality of seawater inlets F is formed circumferentially formed through the inner and outer surfaces of the housing body 11a.

The core electrode 13 includes seawater reaction parts 13a that are a plurality of rods made of a silver-silver chloride and vertically disposed in the circumferential direction of the electrode housing 11.

The seawater filter 15 is formed in a hollow cylindrical shape having a predetermined length and open top and bottom and is vertically disposed in the electrode housing 11, and the seawater reaction parts 13a of the core electrode 13 is disposed therein.

The seawater filter 15 is made of polypropylene, etc., and prevents contamination inside the electrode housing 11 and reduces influence by the speed of a current when seawater outside the electrode housing 11 flows into the electrode housing 11.

A disc-shaped guide block 17 is horizontally disposed at the upper end of the seawater filter 15.

A plurality of through-holes 17a is vertically formed through the guide block 17 and the upper ends of the seawater reaction parts 13a that are a plurality of rods are fitted in the plurality of through-holes 17a formed in the guide block 17, respectively.

Further, lower molding LM is applied to the bottom of the guide block 17 for a waterproofing function.

Further, upper molding UM is applied to the top of the guide block 17 after connecting the silver surfaces of the seawater reaction parts 13a that are silver-silver chloride rods and a signal line S using a conductive adhesive B such as silver paste.

When upper molding UM is applied, a molding material is injected through an injection port E formed at the upper end of the upper cover 11b.

Further, it is preferable that the seawater filter 15 is inserted through the lower portion of the housing body 11a.

If necessary, the electrode may be assembled by fully filling the lower portion of the housing body 11a with a silver chloride/silica mixture.

FIG. 8 is a view showing an underwater electric field sensor employing the underwater electric field sensor electrode of FIG. 5 and FIG. 9 is a view showing the internal structure of the underwater electric field sensor of FIG. 8.

An underwater electric field sensor according to the present disclosure includes: a sensor housing 110 formed in a spherical shape having a plurality of accommodation grooves 112 spaced apart from each other on the outer surface thereof; and the underwater electric field sensor electrode 120 (FIGS. 5 to 7) according to the first embodiment described above which is accommodated in each of the plurality of accommodation grooves 112 formed at the sensor housing 110.

The underwater electric field sensor is applied to a 3-axis underwater electric field sensor having six underwater electric field sensor electrodes 120, and two underwater electric field sensor electrodes 120 are connected to 3-channel signal amplifiers, respectively, in the directions of three perpendicular axes.

FIG. 10 is a view showing a second embodiment of an underwater electric field sensor electrode according to the present disclosure, FIG. 11 is a view showing the internal structure of the underwater electric field sensor electrode of FIG. 10, and FIG. 12 is an exploded view of the underwater electric field sensor electrode of FIG. 10.

A second embodiment of an underwater electric field sensor electrode according to the present disclosure includes an electrode housing 21, a core electrode 23, and a seawater filter 25.

The electrode housing 21 is formed in a hollow disc shape having a predetermined thickness.

The electrode housing 21 is made of a plastic-based material such as polyoxymethylene, protects the core electrode 23 from external shock, and has a shape of an assembly of the core electrode 23 and the seawater filter 25.

The electrode housing 21 includes: a housing body 21a formed in a hollow disc shape and having an open bottom; and a lower cover 21b covering the lower portion of the housing body 21a, and a plurality of seawater inlets F is formed at the housing body 21a and the lower cover 21b.

The core electrode 23 includes a seawater reaction part 23a composed of a plurality of rods made of a silver-silver chloride and horizontally disposed in the circumferential direction of the electrode housing 21.

The seawater filter 25 is provided as a pair of discs having a predetermined thickness, which are transversely disposed in the electrode housing 21 and disposed over and under the seawater reaction part 23a of the core electrode 23, respectively.

The seawater filter 25 is made of polypropylene, etc., and prevents contamination inside the electrode housing 21 and reduces influence by the speed of a current when seawater outside the electrode housing 21 flows into the electrode housing 21.

A cylindrical guide block 27 is longitudinally disposed between the pair of seawater filters 25.

A plurality of through-holes 27a is vertically formed on the outer surface of the guide block 27 and the inner ends of the seawater reaction parts 23a that are a plurality of rods are fitted and fixed in the plurality of through-holes 27a formed in the guide block 27, respectively.

Further, molding M is applied to the inner surface of the guide block 27 after connecting the silver surfaces of the seawater reaction parts 23a that are silver-silver chloride rods and a signal line S using a conductive adhesive B such as silver paste.

In molding M, a molding material is injected through an injection port E formed at the upper end of the housing body 21a.

A fitting hole 25a is formed at the center of each of the pair of the seawater filters 25 and the guide block 27 is fitted in the fitting holes 25a.

FIG. 13 is a view showing an underwater electric field sensor employing the underwater electric field sensor electrode of FIG. 10 and FIG. 14 is a view showing the internal structure of the underwater electric field sensor of FIG. 13.

An underwater electric field sensor according to the present disclosure includes: a sensor housing 210 formed in a spherical shape having a plurality of accommodation grooves 212 spaced apart from each other on the outer surface thereof; and the underwater electric field sensor electrode 220 (FIGS. 10 to 12) according described above which is accommodated in each of the plurality of accommodation grooves 212 formed at the sensor housing 210.

The underwater electric field sensor is applied to a 3-axis underwater electric field sensor having six underwater electric field sensor electrodes 220, and two underwater electric field sensor electrodes 220 are connected to 3-channel signal amplifiers, respectively, in the directions of three perpendicular axes.

FIG. 15 is a view showing a third embodiment of an underwater electric field sensor electrode according to the present disclosure, FIG. 16 is a view showing the internal structure of the underwater electric field sensor electrode of FIG. 15, and FIG. 17 is an exploded view of the underwater electric field sensor electrode of FIG. 15.

A third embodiment of an underwater electric field sensor electrode according to the present disclosure includes an electrode housing 31, a guide block 33, a core electrode 35, and a seawater filter 37.

The electrode housing 31 is formed in a hollow cylindrical shape having a predetermined length.

The electrode housing 31 is made of a plastic-based material such as polyoxymethylene, protects the core electrode from external shock, and has a shape of an assembly of the core electrode 35 and the seawater filter 37.

The electrode housing 31 includes a housing body 31a formed in a hollow cylindrical shape with open top and bottom, an upper cover 31b covering the upper portion of the housing body 31a, and a lower cover 31c covering the lower portion of the housing body 31a.

A plurality of seawater inlets F is circumferentially formed through the inner and outer surfaces of the housing body 31a.

The guide block 33 is formed in a hollow cylindrical shape having a predetermined length and open top and bottom and is longitudinally disposed in the longitudinal direction of the electrode housing 31.

An underwater cable composed of multiple core lines pass through the empty inside of the guide block 33.

Further, a first guide plate 33a having a disc shape is disposed on the outer surface of the upper portion of the guide block 33 and fixed to the upper end of the seawater filter 37, and a second guide plate 33b having a disc shape is disposed on the outer surface of the lower portion of the guide block 33 and fixed to the lower end of the seawater filter 37.

A plurality of through-holes P is vertically formed through the first guide plate 33a and the upper ends of the seawater reaction parts 35a that are a plurality of rods are fitted in the plurality of through-holes P formed in the first guide plate 33a, respectively.

A first coupling hole C1 and a second coupling hole C2 are formed respectively at the centers of the first guide plate 33a and the second guide plate 33b such that the guide block 33 is fitted.

Alternatively, the guide block 33, the first guide plate 33a, and the second guide plate 33b may be integrally formed.

The top of the first guide plate 33a connects the silver surface of the seawater reaction parts 35a that are silver-silver chloride rods and a signal line through a conductive adhesive B, and the signal line S is molded M after being electrically connected with an underwater cable core line.

Further, the underwater cable is disposed through the guide block 33, and a first through-hole H1 and a second through-hole H2 are formed at the upper cover 31b and the lower cover 31c, respectively, to pass the underwater cable.

After the underwater cable is disposed through the first through-hole H1, the guide block 33, and the second through-hole H2, the inside of the upper cover 31b and the inside of the lower cover 31c are molded M for waterproofing.

Further, lower molding may be applied to the bottom of the first guide plate 33a for a waterproofing function.

The core electrode 35 includes seawater reaction parts 35a that are a plurality of rods made of a silver-silver chloride and longitudinally disposed outside the guide block 33 in the circumferential direction of the guide block 33.

The seawater filter 37 is formed in a hollow cylindrical shape having a predetermined length with open top and bottom and is longitudinally disposed in the electrode housing 31.

The seawater filter 37 is made of polypropylene, etc., and prevents contamination inside the electrode housing 31 and reduces influence by the speed of a current when seawater outside the electrode housing 31 flows into the electrode housing 31.

The seawater reaction parts 35a of the core electrode 35 and the guide block 33 are disposed in the seawater filter 37.

FIG. 18 is a view showing an underwater electric field sensor employing the underwater electric field sensor electrode of FIG. 15.

An underwater electric field sensor according to the present disclosure has the underwater electric field sensor electrodes 310 according to the third embodiment described above (FIGS. 15 to 17) which are connected to each other through underwater cables 320, thereby functioning as an array sensor that measures an electric field signal through multiple channels.

The underwater electric field sensor is applied to a 1-axis array sensor and has electrodes as many as the core lines of the underwater cables 320, whereby underwater electric field sensor can be used for an array sensor that measures an electric field signal through multiple channels using the potential difference and gap between electrodes.

The underwater cables 320 are connected to a multi-channel signal amplifier.

Various preferred embodiments of the present disclosure were described above through some examples, but the various embodiments described in "detailed description of the invention" are only examples and it would be clearly understood by those skilled in the art the present disclosure may be changed in various ways or equivalently implemented from the above description.

Further, it should be noted that since the present disclosure may be implemented in other various ways, the present disclosure is not limited to the above description, the above description is provided to completely explain the present disclosure and provided only to completely inform those skilled in the art of the range of the present disclosure, and the present disclosure is defined by only claims.

What is claimed is:

1. An underwater electric field sensor electrode comprising:
   an electrode housing formed in a hollow cylindrical shape having a predetermined length;
   a core electrode including seawater reaction parts that are a plurality of rods made of a silver-silver chloride and vertically disposed in the circumferential direction of the electrode housing; and
   a seawater filter formed in a hollow cylindrical shape having a predetermined length and open top and bottom, vertically disposed in the electrode housing, and having the seawater reaction parts of the core electrode therein,
   wherein the silver surfaces of the seawater reaction parts which are silver-silver chloride rods and signal line are connected by a conductive adhesive and an upper molding formed after the conductive adhesive to contact an upper surface of a guide block.

2. The underwater electric field sensor electrode of claim 1, wherein the electrode housing includes:
   a housing body formed in a hollow cylindrical shape with open top and bottom;
   an upper cover covering an upper portion of the housing body; and
   a lower cover covering a lower portion of the housing body.

3. The underwater electric field sensor electrode of claim 2, wherein a disc-shaped guide block is horizontally disposed at an upper end of the seawater filter,
   a plurality of through-holes is vertically formed through the guide block, and
   upper ends of the seawater reaction parts that are a plurality of rods are fitted and fixed in the plurality of through-holes, respectively.

4. An underwater electric field sensor comprising:
   a sensor housing formed in a spherical shape having a plurality of accommodation grooves spaced apart from each other on an outer surface thereof; and
   an underwater electric field sensor electrode which is accommodated in each of the plurality of accommodation grooves, and comprising;
   an electrode housing formed in a hollow cylindrical shape having a predetermined length;
   a core electrode including seawater reaction parts that are a plurality of rods made of a silver-silver chloride and vertically disposed in the circumferential direction of the electrode housing; and
   a seawater filter formed in a hollow cylindrical shape having a predetermined length and open top and bottom, vertically disposed in the electrode housing, and having the seawater reaction parts of the core electrode therein,
   wherein a silver surfaces of the seawater reaction parts which are silver-silver chloride rods and signal line are connected by a conductive adhesive and an upper molding formed after the conductive adhesive to contact an upper surface of a guide block.

* * * * *